United States Patent
Zhang et al.

(10) Patent No.: US 9,673,762 B2
(45) Date of Patent: Jun. 6, 2017

(54) AMPLIFIER WITH ADJUSTABLE RAMP UP/DOWN GAIN FOR MINIMIZING OR ELIMINATING POP NOISE

(71) Applicant: Cirrus Logic, Inc., Austin, TX (US)

(72) Inventors: Lingli Zhang, Austin, TX (US); Huan Wang, Austin, TX (US); Yongjie Cheng, Austin, TX (US); Christian Larsen, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 14/920,698

(22) Filed: Oct. 22, 2015

(65) Prior Publication Data

US 2016/0118949 A1  Apr. 28, 2016

Related U.S. Application Data (60) Provisional application No. 62/068,245, filed on Oct. 24, 2014.

(51) Int. Cl.
*H03F 3/38* (2006.01)
*H03F 3/185* (2006.01)
*H03F 1/02* (2006.01)
*H03F 3/217* (2006.01)
*H03F 1/30* (2006.01)

(52) U.S. Cl.
CPC ........... *H03F 3/185* (2013.01); *H03F 1/0205* (2013.01); *H03F 1/305* (2013.01); *H03F 3/2171* (2013.01); *H03F 2200/03* (2013.01); *H03F 2200/351* (2013.01)

(58) Field of Classification Search
CPC ... H03F 3/38; H03F 1/14; H03F 1/305; H03F 2200/351
USPC ................... 330/10, 51; 381/94.5, 120, 121
See application file for complete search history.

(56) References Cited

U.S. PATENT DOCUMENTS

| 7,099,907 | B1 | 8/2006 | Nakayama | |
| 7,346,317 | B2* | 3/2008 | Rahman | H04B 1/04 330/284 |
| 8,686,789 | B2 | 4/2014 | Jiang et al. | |
| 9,036,836 | B2* | 5/2015 | Zhang | H03F 3/2173 330/10 |
| 2004/0214614 | A1 | 10/2004 | Aman | |
| 2005/0012546 | A1* | 1/2005 | Jeong | H03F 3/217 330/10 |

(Continued)

FOREIGN PATENT DOCUMENTS

GB        2496664 A       5/2013

*Primary Examiner* — Steven J Mottola
(74) *Attorney, Agent, or Firm* — Norton Rose Fulbright US LLP (57) ABSTRACT

A variable ramp up/down gain in a pre-power stage block of an audio amplifier may be used to reduce audible pops and clicks output by the audio amplifier. A controller may adjust the variable ramp up/down gain during operation of the audio amplifier. The variable ramp up/down gain may be implemented as a pulse width modulation (PWM) modulator/generator with a ramp-up and ramp-down gain under control of the controller. The variable ramp up/down gain smooths transitions of the offset between a pre-power stage block and a feedback loop and thus can reduce audible pops and clicks by reducing the offset that is amplified in the power stage block of the audio amplifier.

17 Claims, 5 Drawing Sheets (56) References Cited

U.S. PATENT DOCUMENTS

| | | |
|---|---|---|
| 2006/0170499 A1 | 8/2006 | Rahman et al. |
| 2006/0182265 A1 | 8/2006 | Sorace et al. |
| 2007/0037530 A1 | 2/2007 | Peckham et al. |
| 2009/0102550 A1 | 4/2009 | Ohama et al. |
| 2009/0231030 A1 | 9/2009 | Li et al. |

* cited by examiner

AMPLIFIER WITH ADJUSTABLE RAMP UP/DOWN GAIN FOR MINIMIZING OR ELIMINATING POP NOISE

FIELD OF THE DISCLOSURE

This application claims the benefit of priority of U.S. Provisional Patent Application No. 62/068,245 to Lingli Zhang et al. filed on Oct. 24, 2014 and entitled "Methods and Apparatuses for Minimizing or Eliminating Pop Noise for an Amplifier," which is incorporated by reference herein.

FIELD OF THE DISCLOSURE

The instant disclosure relates to power amplifiers. More specifically, portions of this disclosure relate to methods, apparatuses, and/or implementations concerning or relating to minimizing or eliminating pop noise for amplifiers, including but not limited to open-loop amplifiers and closed-loop amplifiers.

BACKGROUND

Figure 1:
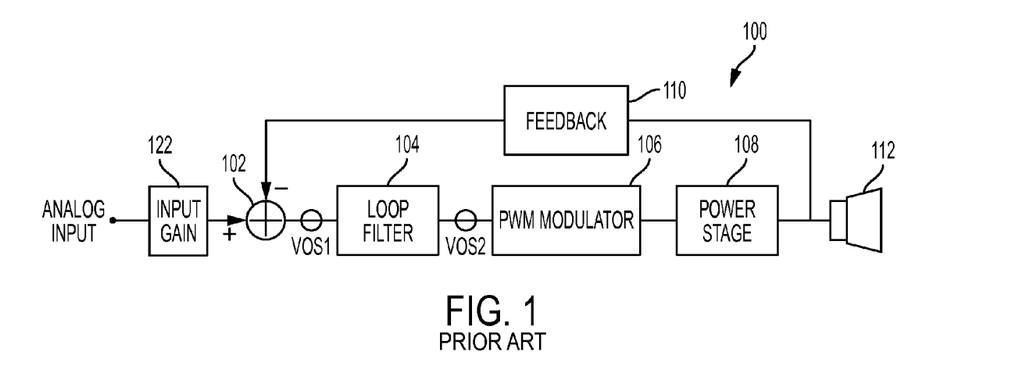
FIG. 1 is a block diagram illustrating an example closed-loop Class-D amplifier architecture according to the prior art.

Amplifiers are electronic devices that may be used to amplify signals, such as by increasing an amplitude of the signal, or to perform other processing of signals. Two example amplifiers include open-loop amplifiers and closed-loop amplifiers. One specific example of a closed-loop amplifier is a Class-D amplifier. FIG. 1 shows such an example closed-loop Class-D amplifier architecture according to the prior art. Closed-loop Class-D amplifier 100 includes a feed-forward path that includes an input gain block 122, a summer 102, a loop filter 104, a pulse-width-modulator (PWM) modulator 106, and a power stage block 108. Amplifier 100 also includes a feedback path 110 that starts at an output of the power stage block 108 and is coupled back to the summer 102. The output of the power stage block 108 can drive a speaker 112 or other transducer. Loop filter 104 may include a number of integrators, and the PWM generator 106 modulates the loop filter 104 output into a PWM signal.

Another example of an amplifier is an open-loop amplifier, which may be similar to the amplifier 100 of FIG. 1, but would not have the feedback path 110 and the loop filter 104 would instead be replaced with an analog filter. Closed-loop amplifiers may be preferred over open-loop amplifiers because closed-loop amplifiers can generally provide better total-harmonic distortion (THD) performance and have a better power supply rejection ratio (PSRR).

In either a closed-loop amplifier, such as shown in FIG. 1, or an open-loop amplifier (not shown), the loop filter 104 or the analog filter (not shown) has a direct-current (DC) offset $V_{OS1}$ from the first integrator at the input of the loop filter 104 or input of the analog filter and a direct-current (DC) offset $V_{OS2}$ from other downstream integrators that is reflected at the filter output. The DC offset may then be magnified by the PWM modulator/generator 106 and then applied directly to the speaker 112 with the fixed gain of PWM modulator/generator 106 during speaker power up and/or down when the closed-loop amplifier transitions from a closed-loop magnified state to a closed-loop steady state. "Closed-loop magnified state" refers to a state where the DC offset is magnified at the amplifier output without any loop filter attenuation. "Closed-loop steady state" refers to the state where the loop filter attenuates the offset $V_{OS2}$ to almost zero and an amplifier output corresponds only to the DC offset $V_{OS1}$. Depending upon the unity-gain-bandwidth of the loop filter 104, it may take many cycles before the magnified DC offset is suppressed. During the delay cycles, the magnified DC offset is not entirely suppressed, and an output of the amplifier may exhibit artifacts. When the amplifier is used to drive a speaker, such as in an audio amplifier, the speaker may create audible pop and/or click noises. Thus, there is a need to further reduce or eliminate the DC offsets $V_{OS1}$ and $V_{OS2}$.

In a conventional loop filter 104, or in an analog filter, the DC offset $V_{OS1}$ is typically designed at a much lower level to reduce the pop noise, but DC offset $V_{OS2}$ is not addressed because, in the closed-loop steady state operations, the contribution from DC offset $V_{OS2}$ is attenuated by the first integrator and is almost zero.

Figure 2:
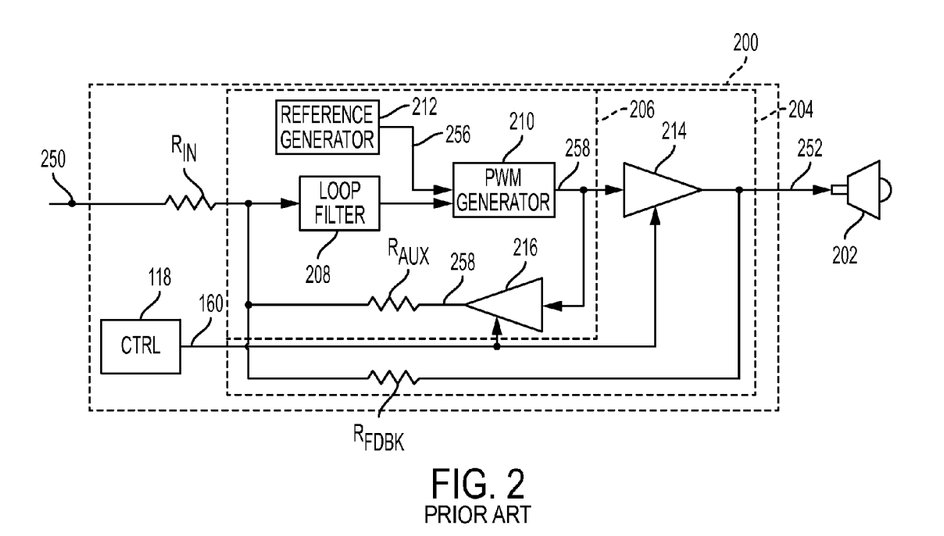
FIG. 2 is a block diagram illustrating a dual-loop amplifier according to the prior art.

One method of handling the DC offset and audible pops and clicks at an amplifier output is to use a dual-loop amplifier architecture. One example is provided in U.S. Pat. No. 8,686,789, which is incorporated by reference herein. FIG. 2 is a block diagram illustrating a dual-loop amplifier according to the prior art. The dual-loop amplifier 200 includes a primary loop 204 and a secondary loop 206. The dual-loop amplifier 200 receives analog input 250 through an input resistor $R_{IN}$ and provides an output signal 252 to drive speaker 202. The primary loop 204 includes a loop filter 208, a pulse-width-modulation (PWM) modulator/generator 210, a reference generator 212, and a power driver 214.

The reference generator 212 provides a reference signal 256, and the PWM modulator/generator 210 provides a corresponding modulated signal 258. The primary loop 204 further has a feedback resistor $R_{FDBK}$ coupled to an output of the power driver 214 and an input of the loop filter 208. The feedback resistor $R_{FDBK}$, in conjunction with the input resistor $R_{IN}$ and/or programmable gain, determines a gain of the primary loop 204. The secondary loop 206 includes the loop filter 208, the PWM modulator/generator 210, the reference generator 212, and an auxiliary driver 216. Secondary loop 206 also includes auxiliary resistor $R_{AUX}$. Auxiliary resistor $R_{AUX}$ is coupled between an output of the auxiliary driver 216 and an input of the loop filter 208. The auxiliary resistor $R_{AUX}$, in conjunction with the input resistor $R_{IN}$ and the programmable gain, determines a gain of the secondary loop 206.

Figure 3:
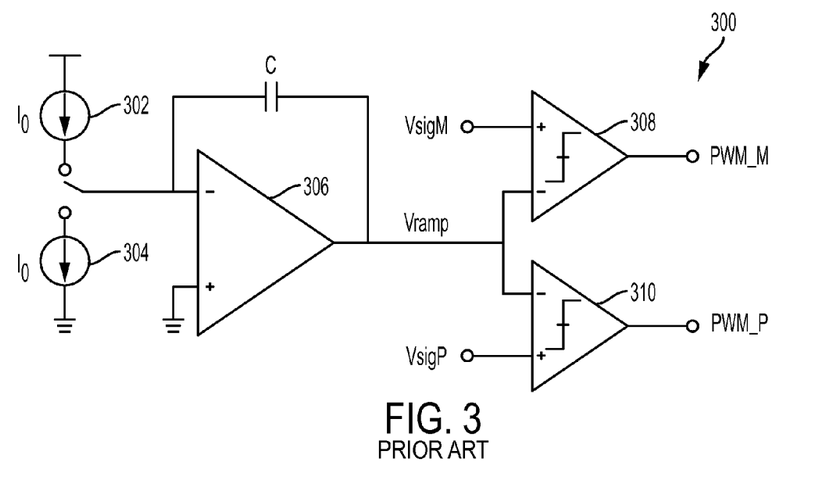
FIG. 3 is a circuit schematic illustrating an example fixed-gain PWM modulator/generator in accordance with the prior art.

FIG. 3 shows an example fixed-gain PWM modulator/generator 300 in accordance with the prior art, which may be used, for example, as the PWM modulator/generator 106 of FIG. 1. PWM modulator/generator 300 includes fixed current sources 302 and 304, capacitor C, amplifier 306, and comparators 308 and 310. Current signals from current sources 302 and 304 provide one of the inputs to the PWM modulator/generator 300 at an inverting input of the amplifier 306, and the non-inverting input can be coupled to ground. The output of the amplifier 306 is a triangle or ramp reference signal $V_{ramp}$, and the voltage signal $V_{ramp}$ is fed into each of the respective inverting inputs for the comparators 308 and 310. The loop filter outputs $V_{sigP}$ and $V_{sigM}$ are also fed into the corresponding comparators 308 and 310. The comparators 308 and 310 compare the loop filter outputs $V_{sigP}$ and $V_{sigM}$ and the reference voltage $V_{ramp}$ to produce digital PWM signals PWM_M and PWM_P.

Figure 4:
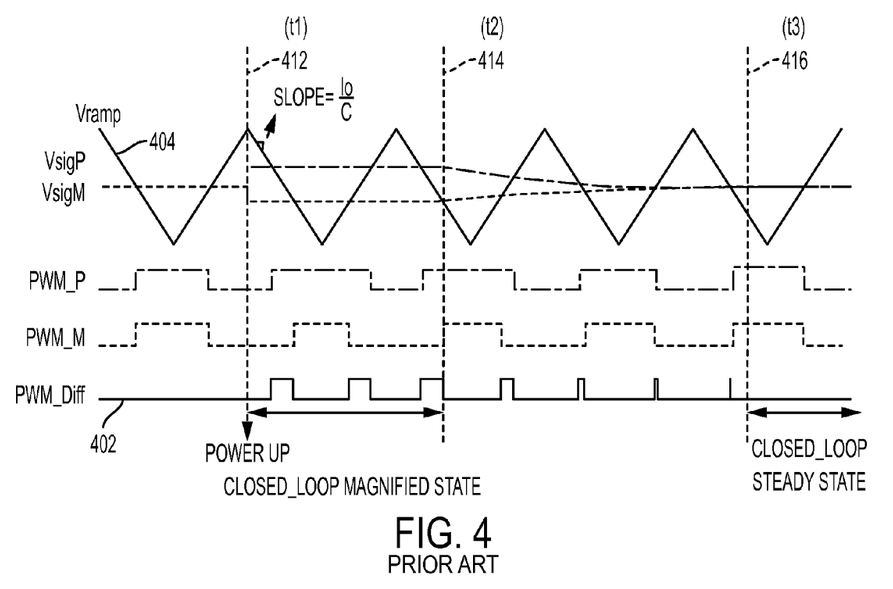
FIG. 4 are graphs illustrating example signal timing diagrams and example relationships for signals in a Class-D amplifier in accordance with the prior art.

FIG. 4 shows example signal timing diagrams and example relationships for the voltage inputs $V_{sigP}$ and $V_{sigM}$ and outputs PWM_P and PWM_M of comparators 308 and 310 for PWM modulator/generator 300 in FIG. 3 according to the prior art. For the diagram of FIG. 4, the PWM modulator/generator 300 is assumed to be configured in the closed-loop architecture shown in FIG. 1. The average voltage of modulator output PWM_Diff shown in line 402 is determined in accordance with the following equation:

$$V_{pwm\_diff} = (V_{sigP} - V_{sigM}) * V_{DD} \Big/ \Big(\frac{I}{C} * T\Big),$$

where T is ramp period or half of triangle period and $V_{DD}$ is the modulator supply voltage. The PWM modulator/generator gain is then defined by the following equation:

$$\text{gain} = \frac{V_{pwm_{diff}}}{V_{sigP} - V_{sigM}} = V_{DD} \Big/ \Big(\frac{I}{C} * T\Big).$$

The slope of the ramp reference signal $V_{ramp}$ shown as line 404 is fixed because the gain of the PWM generator 300 is fixed and does not vary. Because the slope of $V_{ramp}$ is fixed and the loop of the amplifier 100 of FIG. 1 has a limited bandwidth, during loop power up or down, any offset voltage or signal at the output of the loop filter 104 will be amplified through the feedforward path and outputted from the power stage block 108 when the loop filter 104 transitions from closed-loop magnified state to closed-loop steady state. This amplified offset can be heard through the speaker 112, such as in the form of an audible pop(s) or click(s).

Referring back to FIG. 4, the closed-loop amplifier is powered on at time $t_1$ shown as time 412. Before being powered on, the loop filter differential output is zero, and PWM_Diff is zero. Between times $t_1$ and $t_2$ (shown as time 414), when the amplifier is in the closed-loop magnified state, the direct-current (DC) offset appears at loop filter outputs $V_{sigP}$ and $V_{sigM}$ and is amplified by the PWM generator to generate a non-zero PWM_Diff. After time $t_2$, the loop filter starts to attenuate the offset. After time $t_3$ at time 416, the loop filter runs in the closed-loop steady state, when the offset $V_{OS2}$ is attenuated to a low level and only a small residual offset $V_{OS1}$ remains in the PWM_Diff signal.

Shortcomings mentioned here are only representative and are included simply to highlight that a need exists for improved electrical components, particularly for amplifiers employed in consumer-level devices, such as mobile phones and media players. Embodiments described herein address certain shortcomings but not necessarily each and every one described here or known in the art.

SUMMARY

The embodiments of the present disclosure eliminate or significantly reduce or solve the problems of audible pops and clicks related to an audio amplifier by providing a variable ramp up/down gain in a pre-power stage block of the audio amplifier and a controller that adjusts the variable ramp up/down gain during operation of the audio amplifier. In one embodiment, the variable ramp up/down gain may be implemented as a pulse width modulation (PWM) generator with a ramp-up and ramp-down gain under control of the controller. The variable ramp up/down gain smooths transitions of the offset $V_{OS1}$ and $V_{OS2}$ and thus can reduce audible pops and clicks by reducing the offset $V_{OS1}$ and $V_{OS2}$ that is amplified in the power stage block of the audio amplifier.

According to one embodiment, an apparatus may include an input node configured to receive an input analog signal for reproduction by a transducer; a pre-power stage block coupled to the input node and configured to process the input analog signal, wherein the pre-power stage block comprises a component with a configurable ramp up/down gain; a power stage block coupled to the pre-power stage block and configured to amplify the processing input analog signal; and/or a feedback loop coupled between an output of the power stage and an input of the pre-power stage block; and/or a controller coupled to the pre-power stage block and configured to vary the configurable gain of the pre-power stage block during a transition of the feedback loop.

In certain embodiments, the pulse-width modulation (PWM) modulator/generator of the pre-power stage block may have the configurable gain; the configurable gain may be outside a plurality of loop filter integrators of a loop filter of the pre-power stage block; the controller may be configured to vary the configurable ramp up/down gain of the pre-power stage block to reduce a voltage offset due to the pre-power stage block; the controller may be configured to vary the configurable ramp up/down gain of the pre-power stage block during a transition of the feedback loop from a closed-loop magnified state to a closed-loop steady state; and/or the controller may be configured to vary the configurable ramp up/down gain to attenuate pop/click levels at the output of the power stage.

According to another embodiment, a method may include receiving an input analog signal for amplification; processing the input analog signal in a pre-power stage block, wherein the step of processing includes varying a configurable ramp up/down gain of the pre-power stage block; amplifying the processed signal in a power stage block; and/or feeding back the amplified signal to the pre-power stage block through a feedback loop, wherein the step of varying the configurable ramp up/down gain of the pre-power stage block occurs during a transition of the feedback loop.

In certain embodiments, the step of varying the configurable ramp up/down gain may include varying a configurable ramp up/down gain of a pulse-width modulation (PWM) modulator/generator of the pre-power stage block; the step of varying the configurable ramp up/down gain may include varying a configurable ramp up/down gain outside of a plurality of loop filter integrators of a loop filter of the pre-power stage block; the step of varying the configurable ramp up/down gain may be performed by a controller beginning at a time when the feeding back effectively closes a loop around the pre-power stage block and the power stage block or transitions from a closed-loop magnified state to a closed-loop steady state; the step of determining to vary the configurable ramp up/down gain may include varying the configurable ramp up/down gain to reduce a voltage offset due to the processing in the pre-power stage block; the step of determining to vary the configurable ramp up/down gain may include varying the configurable ramp up/down gain during a transition of the feedback loop from a closed-loop magnified state to a closed-loop steady state; and/or the step of determining to vary the configurable ramp up/down gain may include varying the configurable ramp up/down gain to attenuate pop/click levels at the output of the power stage.

According to another embodiment, an apparatus may include a controller configured to couple to an amplifier circuit. The controller may be configured to perform steps including determining a start time for a feedback loop around a pre-power stage block and a power stage block of the amplifier circuit to transition from a closed-loop magnified state to a closed-loop steady state; determining a ramp up/down gain of a configurable ramp up/down gain element of a pre-power stage block of the amplifier circuit after determining the start time of feedback loop transition; and/or adjusting the configurable ramp up/down gain of the pre-power stage block while the feedback loop is in transition from a first status to a second status to the determined ramp up/down gain.

In certain embodiments, the controller may be configured to determine the ramp up/down gain of the configurable ramp up/down gain element to reduce a voltage offset due to the pre-power stage block; the controller may be configured to determine the gain of the configurable ramp up/down gain element during a transition of the feedback loop from a closed-loop magnified state to a closed-loop steady state; the controller may be configured to determine the ramp up/down gain of a pulse-width modulation (PWM) generator of the amplifier circuit; and/or the controller may be configured to determine the ramp up/down gain of a configurable ramp up/down gain element outside of a plurality of loop filter integrators of a loop filter of the amplifier circuit.

In some embodiments, the apparatus may also include an input node configured to receive an input analog signal for amplification by the amplifier circuit, wherein the input node is coupled to the amplifier circuit; a transducer coupled to an output of the amplifier circuit, wherein the transducer is configured to reproduce a representation of the input analog signal processed by the pre-power stage block and amplified by the power stage block; and/or the amplifier circuit may include a pre-power stage block coupled to the input node; and/or a power stage block coupled to the pre-power stage block, wherein the feedback loop couples an output of the power stage block to an input of the pre-power stage block.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

The voltage offsets between components in the amplifier may be reduced through the use of components with variable ramp up/down gain, such as a variable ramp up/down gain PWM modulator/generator. This voltage offset, when magnified by an amplifier, can cause unintentional artifacts in an output signal, which may be heard as clicks and pops in an audio amplifier. Thus, embodiments of the present disclosure used in audio amplifiers may eliminate or reduce the problems of audible pops and clicks by providing, for example, a PWM modulator/generator with a ramp-up and ramp-down gain.

Figure 5:
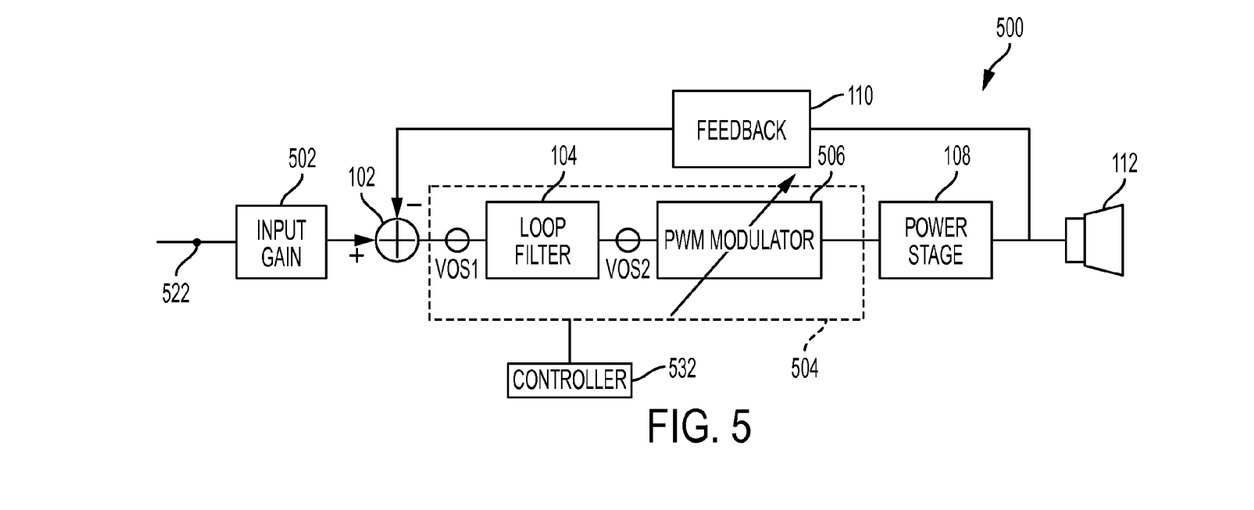
FIG. 5 is a block diagram illustrating an example closed-loop Class-D amplifier architecture with variable ramp up/down gain according to one embodiment of the disclosure.

An example embodiment of a closed-loop Class-D amplifier with a variable gain up/down PWM generator is shown in FIG. 5. A closed-loop Class-D amplifier 500 is similar to the closed-loop Class-D amplifier 100 of FIG. 1, except that the fixed gain PWM generator 106 is replaced with a PWM modulator/generator 506 with variable ramp-up gain and/or ramp-down gain. Closed-loop Class-D amplifier 500 includes a feedforward path that includes the summer 102, a pre-power stage block 504, including the loop filter 104 and the pulse width modulation (PWM) modulator/generator 506 with variable gain, and the power stage block 108. The amplifier 500 also includes a feedback path 110 that starts at an output of the power stage block 108 and is coupled back to the summer 102. The output of the power stage block 108 may drive a speaker 112, or other transducer or other load. The loop filter 104 may include integrators, and the PWM modulator/generator 506 with ramp-up gain and/or ramp-down gain may modulate, into a PWM wave, an analog input signal received at input node 522 and amplified in input gain block 502.

The PWM modulator/generator 506 may provide a variable ramp-up/ramp-down gain in a single loop amplifier system. The variable ramp-up/ramp-down gain helps provide a smooth transition from a first status, such as a closed-loop magnified state, to a second status, such as a closed-loop steady state, for attenuating pop/click levels at the speaker output. In certain embodiments, variable or ramping gain PWM modulator/generator 506 may be part of a simple variable gain stage. The loop filter 104 of Class-D amplifier 500 may be an ideal low pass filter that is approximating an integrator.

The variable gain of the pre-power stage block 504, such as a variable ramp up/down gain of the PWM modulator/generator 506, may be varied by a controller 532. The controller 532 may start to ramp up/down the gain when the loop is controlled to start transitioning from one state to another state, such as a closed-loop transitioning from a closed-loop magnified state to a closed-loop stead state. The ramp up/down of the gain may include a linear ramp, a 5-step ramp, a 10-step ramp, or any other ramp configuration. The ramp time may be selected from, for example, 200 microseconds, 400 microseconds, 600 microseconds, 800 microseconds, and 1 millisecond.

Figure 6:
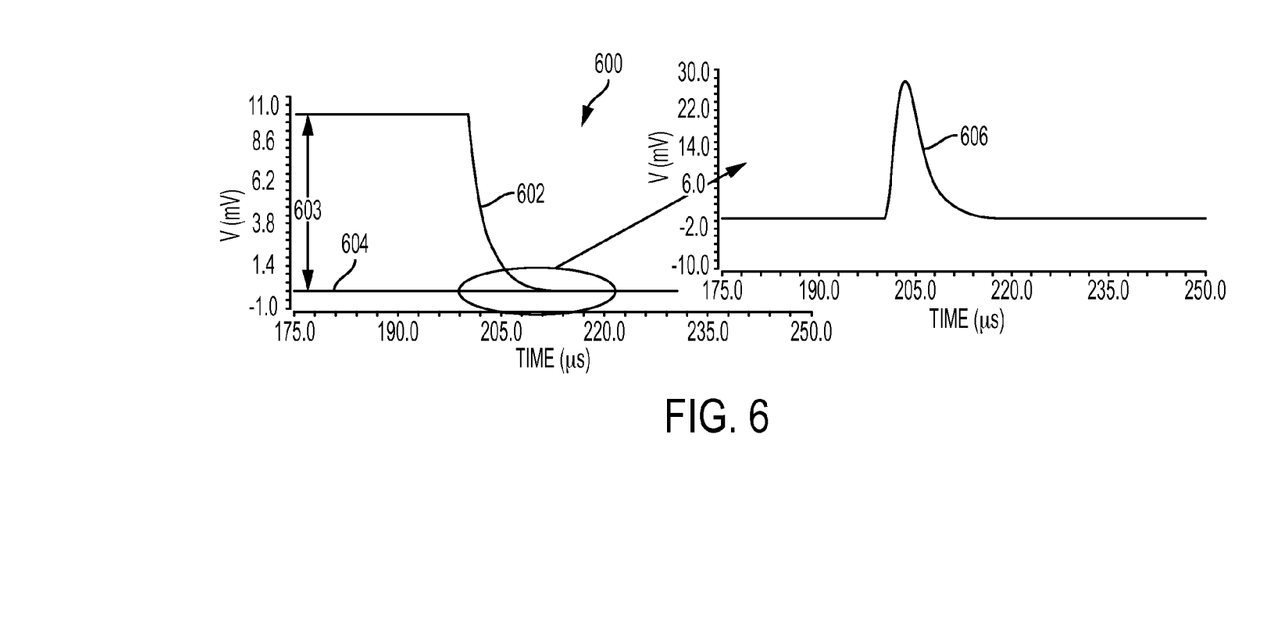
FIG. 6 are graphs illustrating example output waveforms of a Class-D amplifier according to one embodiment of the disclosure.

FIG. 6 shows example waveforms comparing the output voltage of Class-D amplifier 100 (e.g., an output of the power stage block 108 of FIG. 1) that implements a fixed gain PWM modulator/generator 106 with an output voltage of the Class-D amplifier 500 that implements a variable gain PWM modulator/generator 506. A waveform 602 shows an example output voltage of the Class-D amplifier 100 with the fixed gain PWM modulator/generator 106. A waveform 604 shows an example output voltage of the Class-D amplifier 500 with PWM modulator/generator 506 with ramp-up gain and/or ramp-down gain. The waveform 602 shows that when the gain is fixed for PWM generator 106, an offset voltage 603 that is equal to or about 10 mV is evident at the output of the amplifier 100. The output voltage is affected by the offset voltage 603 for about 25 microseconds during the closed-loop magnified state. At or around 200 microseconds, the output voltage of the PWM generator 106 begins decreasing towards and settles to zero at or around 211 microseconds during a closed-loop steady state condition.

A similar input to the Class-D amplifier 500 shows an improved capability of reducing an offset that eventually reaches the amplifier. The waveform 604 shows that when the gain is variable or ramping (such as ramping-up or ramping-down), such an offset voltage 603 does not exist or is not effectively evident at the output voltage of Class-D amplifier 500. If such offset voltage does exist at the output, it is of nominal value or very small in comparison to the offset voltage 603 of the waveform 602. The waveform 604 shows the behavior when example variable or ramping PWM generator 506 ramps up from a zero (0) gain to a gain of four (4) in 200 microseconds. Because of the variable or ramping gain, waveform 604 shows that the output voltage of Class-D amplifier 500 is relatively flat. A nominal or small offset voltage (e.g., that cannot be generally seen in waveform 604) may exist, but it is not evident as compared with the offset voltage 603 in the waveform 602. Waveform 606 shows an exploded view of a part of the waveform 604 showing a small increase and ramp-up in an output of the Class-D amplifier 500 occurring around 200 microseconds while the amplifier 500 is in a closed-loop magnified state. At or around 203 microseconds, the output voltage of amplifier 500 decreases, and the output voltage then levels off and settles down to around 0 volts at or around 214 microseconds. The decrease that occurs during approximately the 203 to 214 microsecond period is generally due to the loop of amplifier 500 transitioning from a closed-loop magnified state to a closed-loop steady state and that the closed loop is starting to take over for providing the output voltage of amplifier 500. The amount of voltage ramp-up and ramp-down shown in the waveform 606 is close to 30 microVolts, which is 50 dB lower compared to the 10 mV offset voltage 603 of the waveform 602.

Figure 7:
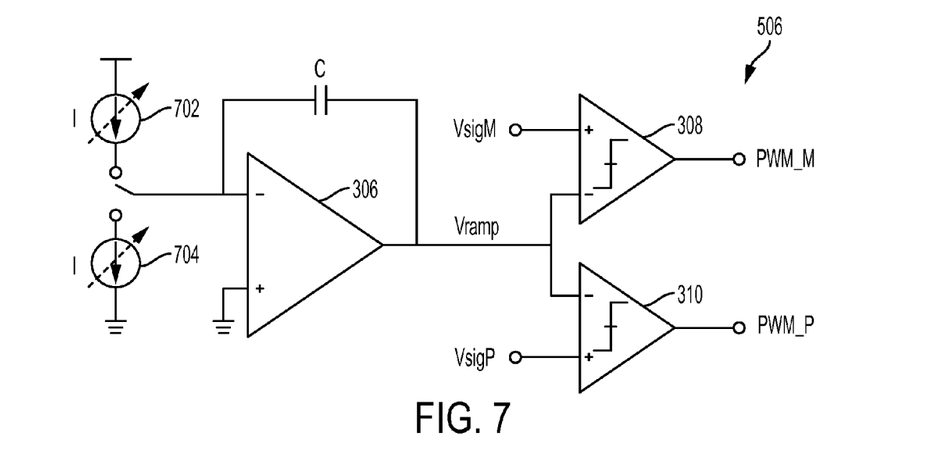
FIG. 7 is a circuit schematic illustrating an example variable or ramping gain pulse width modulation (PWM) modulator according to one embodiment of the disclosure.

The variable ramp up/down gain described above and shown in the amplifier 500 of FIG. 5, may be provided by the PWM modulator/generator 506. In other embodiments, the variable ramp up/down gain may be provided in other components of the amplifier 500, such as in a component outside a plurality of loop filter integrators of a loop filter of the pre-power stage block. An embodiment of a PWM modulator/generator 506 with variable ramp up/down gain is shown in FIG. 7. FIG. 7 is a circuit schematic illustrating an example variable or ramping gain pulse width modulation (PWM) modulator according to one embodiment of the disclosure. The PWM modulator/generator 506 is similar to that of FIG. 3, but instead of including current sources 302 and 304, PWM modulator/generator 506 instead includes variable or ramping (ramp-up and/or ramp-down) current sources 702 and 704. The PWM modulator/generator 506 also includes capacitor C, amplifier 306, and comparators 308 and 310.

Current signals from current sources 702 and 704 provide one input to PWM modulator/generator 506 at an inverting input of the amplifier 306, and the non-inverting input may be coupled to ground. The output of the amplifier 306 may be a triangle or ramp reference signal $V_{ramp}$, and the voltage signal $V_{ramp}$ is fed into each of the respective negative inputs for corresponding comparators 308 and 310. The loop filter output signals $V_{sigP}$ and $V_{sigM}$ are provided to the corresponding comparators 308 and 310. The comparators 308 and 310 compare the loop filter outputs and triangle or ramp reference voltage $V_{ramp}$ to produce digital PWM signals PWM_M and PWM_P.

Figure 8:
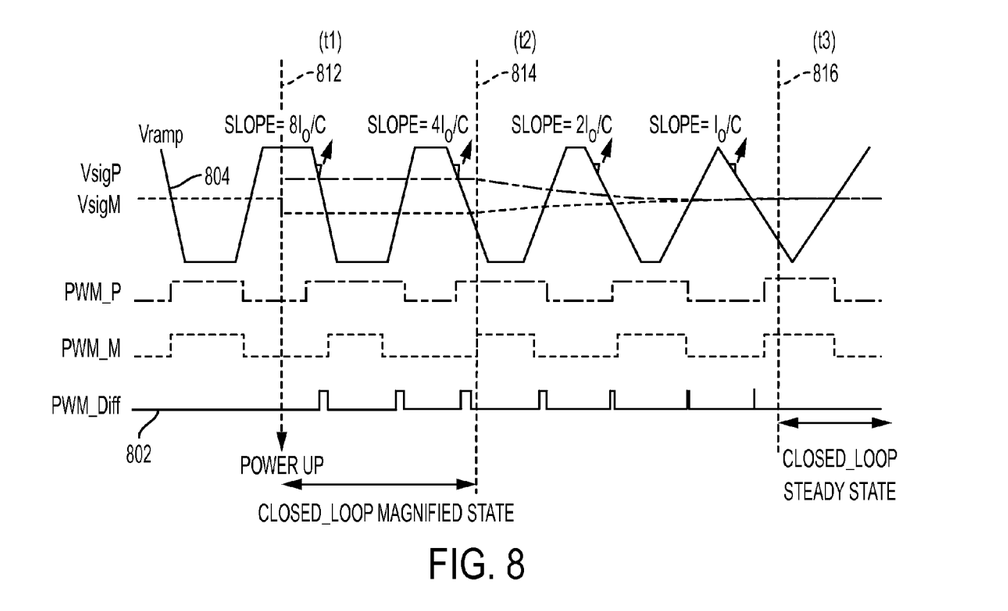
FIG. 8 are graphs illustrating example signal timing diagrams and example relationships for signals in a Class-D amplifier according to one embodiment of the disclosure.

An example operation of the amplifier 500 is shown through the waveforms of FIG. 8. FIG. 8 are graphs illustrating example signal timing diagrams and example relationships for the voltage inputs $V_{sigP}$ and $V_{sigM}$ and outputs PWM_P and PWM_M of comparators 308 and 310 for PWM modulator/generator 506. The average voltage of modulator output PWM_Diff shown as waveform 802 may be determined in accordance with the following equation:

$$V_{pwm\_diff} = (V_{sigP} - V_{sigM}) * V_{DD} / \left(\frac{I}{C} * T\right).$$

The PWM generator gain may then be computed according to the following equation:

$$\text{gain} = \frac{V_{pwm_{diff}}}{V_{sigP} - V_{sigM}} = V_{DD} / \left(\frac{I}{C} * T\right).$$

The slope of the $V_{ramp}$ signal shown as waveform 804 is shown to vary because the gain of the PWM modulator/generator 506 varies or ramps up/ramps down. In some embodiments, the slope of $V_{ramp}$ signal varies from $8I_0/C$ to $4I_0/C$ to $2I_0/C$ to $I_0/C$ over time. The controller 532 of FIG. 5 may control the $V_{ramp}$ signal ramp rate from $8I_0/C$ to $I_0/C$ beginning after a time that the amplifier 500 transitions from a closed-loop magnified state to a closed-loop steady state.

The closed-loop amplifier is powered on at time $t_1$ at time 812. Before being powered on, the loop filter differential output may be zero, and thus PWM_Diff is zero. Between times $t_1$ and $t_2$ (at time 814) when the amplifier is in a closed-loop magnified state, the gain of PWM modulator/generator 506 may be varied or ramped in a manner so that a large offset or voltage jump is avoided or minimized. After time $t_2$, the loop filter starts to attenuate the offset. After time $t_3$ (at time 816), the loop filter runs in the closed-loop steady state when the offset $V_{OS2}$ is attenuated to a reduced level. Further, only a very small residue offset $V_{OS1}$ exists for PWM_Diff. By avoiding or minimizing the large offset or voltage jump, the output at speaker 112 of the amplifier 500 may have a peak that is attenuated.

Figure 9:
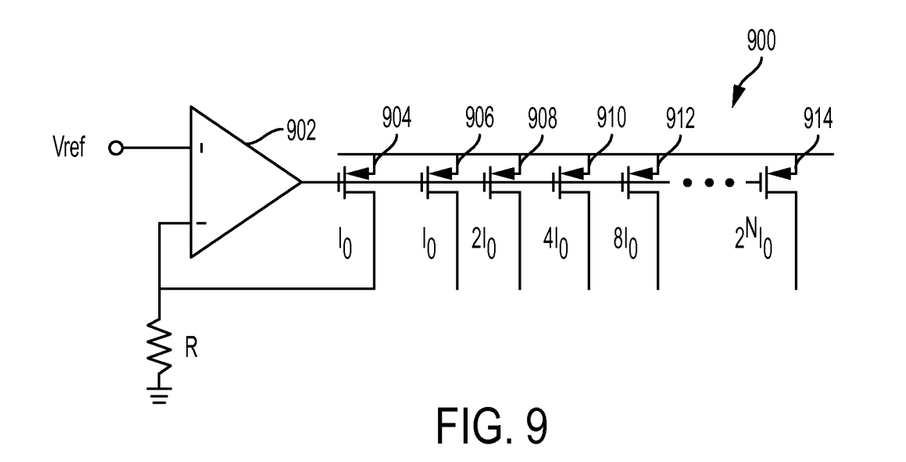
FIG. 9 is a circuit diagram illustrating an example variable current source according to one embodiment of the disclosure.

The variable current sources 702 and 704 may be implemented in some embodiments by the circuit illustrated in FIG. 9. FIG. 9 is a circuit diagram illustrating an example variable current source according to one embodiment of the disclosure. Variable current source 900 may include an operational amplifier (op amp) 902 and a plurality of field effect transistors 904, 906, 908, 912, . . . , 914 that provide respective current signals $I_0, I_0, 2I_0, 4I_0, 8I_0, \ldots, 2^N I_0$. A reference voltage $V_{ref}$ and resistor R at an input of the op-amp 902 may determine the current level from variable current source 900. In one embodiment, the controller 532 of FIG. 5 may vary the ramp up/down gain by controlling the reference voltage $V_{ref}$ through a control signal.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although audio amplifiers are described throughout the detailed description, aspects of the invention may be applied to the design of other amplifiers, such as amplifiers for radio telecommunications circuits and/or amplifiers for sensing small signals. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
an input node configured to receive an input analog signal for reproduction by a transducer;
a pre-power stage block coupled to the input node and configured to process the input analog signal, wherein the pre-power stage block comprises a pulse-width modulation (PWM) generator with a configurable ramp up/down gain;
a power stage block coupled to the pre-power stage block and configured to amplify the processing input analog signal;
a feedback loop coupled between an output of the power stage and an input of the pre-power stage block; and
a controller coupled to the pulse-width modulation (PWM) generator and configured to vary the configurable gain of the pre-power stage block via the pulse-width modulation (PWM) generator during a transition of the feedback loop.

2. The apparatus of claim 1, wherein the configurable gain is outside a plurality of loop filter integrators of a loop filter of the pre-power stage block.

3. The apparatus of claim 1, wherein the controller is configured to vary the configurable ramp up/down gain of the pre-power stage block to reduce a voltage offset due to the pre-power stage block.

4. The apparatus of claim 1, wherein the controller is configured to vary the configurable ramp up/down gain of the pre-power stage block during a transition of the feedback loop from a closed-loop magnified state to a closed-loop steady state.

5. The apparatus of claim 1, wherein the controller is configured to vary the configurable ramp up/down gain to attenuate pop or click levels at the output of the power stage.

6. A method, comprising:
receiving, by an amplifier, an input analog signal for amplification;
processing the input analog signal in a pre-power stage block, wherein the step of processing includes varying a configurable ramp up/down gain of the pre-power stage block via a pulse-width modulation (PWM) generator;
amplifying the processed signal in a power stage block; and
feeding back the amplified signal to the pre-power stage block through a feedback loop, wherein the step of varying the configurable ramp up/down gain of the pre-power stage block via the pulse-width modulation (PWM) generator occurs during a transition of the feedback loop.

7. The method of claim 6, wherein the step of varying the configurable ramp up/down gain comprises varying a configurable ramp up/down gain outside of a plurality of loop filter integrators of a loop filter of the pre-power stage block.

8. The method of claim 6, wherein the step of varying the configurable ramp up/down gain is performed by a controller varying the ramp up/down gain during a time when the feeding back transitions from a closed-loop magnified state to a closed-loop steady state.

9. The method of claim 8, wherein the step of varying the configurable ramp up/down gain comprises varying the configurable ramp up/down gain to reduce a voltage offset due to the processing in the pre-power stage block.

10. The method of claim 8, wherein the step of varying the configurable ramp up/down gain comprises varying the configurable ramp up/down gain during a transition of the feedback loop from a closed-loop magnified state to a closed-loop steady state.

11. The method of claim 8, wherein the step of varying the configurable ramp up/down gain comprises varying the configurable ramp up/down gain to attenuate pop/click levels at the output of the power stage.

12. An apparatus, comprising:
a controller configured to couple to an amplifier circuit, wherein the controller is configured to perform steps comprising:
determining a feedback loop around a pre-power stage block and a power stage block of the amplifier circuit has effectively closed;
determining a ramp up/down gain of a configurable ramp up/down gain element of a pre-power stage block of the amplifier circuit after determining the feedback loop has effectively closed; and
adjusting the configurable ramp up/down gain of the pre-power stage block while the feedback loop is in transition from a first status to a second status to the determined ramp up/down gain.

13. The apparatus of claim 12, wherein the controller is configured to determine the ramp up/down gain of the configurable ramp up/down gain element to reduce a voltage offset due to the pre-power stage block.

14. The apparatus of claim 12, wherein the controller is configured to determine the gain of the configurable ramp up/down gain element during a transition of the feedback loop from a first status of a closed-loop magnified state to a second status of a closed-loop steady state.

15. The apparatus of claim 12, wherein the controller is configured to determine the ramp up/down gain of a pulse-width modulation (PWM) generator of the amplifier circuit.

16. The apparatus of claim 12, wherein the controller is configured to determine the ramp up/down gain of a configurable ramp up/down gain element outside of a plurality of loop filter integrators of a loop filter of the amplifier circuit.

17. The apparatus of claim 12, further comprising:
an input node configured to receive an input analog signal for amplification by the amplifier circuit, wherein the input node is coupled to the amplifier circuit,
wherein the amplifier circuit comprises:
a pre-power stage block coupled to the input node; and
a power stage block coupled to the pre-power stage block, wherein the feedback loop couples an output of the power stage block to an input of the pre-power stage block; and
a transducer coupled to an output of the amplifier circuit, wherein the transducer is configured to reproduce a representation of the input analog signal processed by the pre-power stage block and amplified by the power stage block.

* * * * *